(12) United States Patent
Shimamura et al.

(10) Patent No.: US 6,808,773 B2
(45) Date of Patent: Oct. 26, 2004

(54) SHIELDING BASE MEMBER AND METHOD OF MANUFACTURING THE SAME

(75) Inventors: Masayoshi Shimamura, Tokyo (JP); Ryohei Okamoto, Tokyo (JP); Yoshiyuki Atsuchi, Tokyo (JP)

(73) Assignee: Kyodo Printing Co., Ltd. (JP)

( * ) Notice: Subject to any disclaimer, the term of this patent is extended or adjusted under 35 U.S.C. 154(b) by 5 days.

(21) Appl. No.: 10/147,905

(22) Filed: May 20, 2002

(65) Prior Publication Data

US 2003/0007341 A1 Jan. 9, 2003

(30) Foreign Application Priority Data

May 24, 2001 (JP) ........................................ 2001-155747
Feb. 28, 2002 (JP) ........................................ 2002-054810

(51) Int. Cl.[7] .............................................. B32B 15/08
(52) U.S. Cl. ..................... 428/40.1; 313/112; 428/40.9; 428/41.7; 428/41.9; 428/42.1; 428/201; 428/209
(58) Field of Search ............................. 428/40.1, 41.7, 428/41.9, 42.1, 201, 209, 40.9; 313/112

(56) References Cited

U.S. PATENT DOCUMENTS

2002/0180324 A1 * 12/2002 Yoshida ...................... 313/112

FOREIGN PATENT DOCUMENTS

| JP | 411194215 | * | 7/1999 |
| JP | 2000-13089 | | 1/2000 |
| JP | 2000-59074 | | 2/2000 |
| JP | 2000059078 A | * | 2/2000 |
| JP | 2000-216589 | | 8/2000 |
| JP | 2000-286594 | | 10/2000 |
| JP | 2000-315889 | | 11/2000 |
| JP | 2000-323891 | | 11/2000 |
| JP | 2001-53488 | | 2/2001 |
| JP | 2001-134198 | | 5/2001 |

* cited by examiner

Primary Examiner—Nasser Ahmad
(74) Attorney, Agent, or Firm—Lorusso, Loud & Kelly

(57) ABSTRACT

A radiation shielding structure includes a first adhesive layer, a resin layer, and a metal foil laminated sequentially on a release layer of a plastic film. A metal layer pattern is formed from the metal foil. The first adhesive layer, the resin layer, and the metal layer pattern are formed sequentially from the bottom on a transparent substrate by separating the release layer from the first adhesive layer along an interface and then adhering the first adhesive layer to the transparent substrate.

16 Claims, 11 Drawing Sheets

PDP side

PDP side

PDP side

PDP side

PDP side

PDP side

PDP side

SHIELDING BASE MEMBER AND METHOD OF MANUFACTURING THE SAME

CROSS-REFERENCE TO RELATED APPLICATIONS

This application claims, under 35 USC 119, priority of Japanese Application No. 2001-155747 filed May 24, 2001 and Japanese Application No. 2002-54810 filed Feb. 28, 2002.

BACKGROUND OF THE INVENTION

1. Field of the Invention

The present invention relates to a shielding base member and a method of manufacturing the same and, more particularly, a shielding base member for shielding from electromagnetic radiation, etc., that leak out from the PDP (Plasma Display Panel), etc. and a method of manufacturing the same.

2. Description of the Related Art

In recent years, the applications of the PDP (Plasma Display Panel), which has a wide viewing angle and good display quality and provides a large screen, have broadened quickly into multimedia display devices, etc.

The PDP is a display device that utilizes a gaseous discharge. The gas that is sealed in the tube is excited by using the discharge to generate a line spectrum that has a wide wavelength range extending from the ultraviolet range to the near-infrared range. A fluorescent substance is arranged in the tube of the PDP. This fluorescent substance is excited by the line spectrum in the ultraviolet range to generate light in the visible range. A part of the line spectrum in the near-infrared range is emitted from the surface glass of the PDP to the outside of the tube.

The wavelength in this near-infrared range is close to the wavelength (800 nm to 1000 nm) that is employed in a remote control unit, optical communication, etc. If these devices are operated near the PDP, it is possible that a malfunction maybe caused and therefore leakage of the near-infrared ray from the PDP must be prevented.

Also, the electromagnetic radiation such as microwave, ultra low frequency radiation, etc., are generated by the operation of the PDP, and then leak out to the outside, although amount of the leakage is very small. Since the provisions for leakage of electromagnetic radiation, etc., are specified in the information device or equipment, or the like, the leakage of the electromagnetic waves must be suppressed below the specified value.

In addition, when rays of light are incident upon the display screen from the outside, the incident light is reflected by the display screen and also the contrast ratio of the screen is lowered since the display screen of the PDP is flat. Therefore, the reflection of the incident light from the outside must be suppressed.

For the purpose of satisfying these requirements, a shielding base member is arranged in front of the display screen of the PDP.

In the related art, such a shielding base member is manufactured by the method in which a plastic film to which a metal foil is adhered is pasted on the transparent glass substrate and then the metal foil is patterned, or the like. More particularly, normally the thickness of the metal foil is thin, such as about 10 $\mu$m. Therefore, in order to make the handling of the metal foil easy, first the metal foil is pasted onto the plastic film. Then, in order to pattern the metal foil with good precision, the plastic film having the metal foil thereon is pasted on the glass substrate that has strong rigidity, and then the metal foil is patterned.

In the related art, because the metal foil and the plastic film are formed integrally to make the handling of the metal foil easy, if the shielding base member is manufactured using same, the plastic film remains on the shielding base member. The plastic film has low optical transmittance and high haze (degree of opaqueness), as compared with the transparent glass substrate.

Accordingly, since the plastic film remains on the shielding base member, the optical transmittance of the shielding base member is lowered and the haze (degree of opaqueness) the shielding base member is increased. As a result, there is the problem of poorer visibility of the screen of the PDP due to the shielding base member.

In order to further increase the rigidity of the plastic film on which the metal foil is pasted, there is the shielding base member in which the metal foil is pasted onto the plastic film via an adhesive layer. In the case that the plastic film is rolled up on a roller in manufacture utilizing the roll-to-roll method, etc., if the adhesive layer is pressed by foreign matter, etc., dents are readily formed occurs in the adhesive layer because the adhesive layer is soft in itself and the quality of the shielding base member is lowered.

In other related art, the shielding base member includes a plastic film having a near-infrared absorbing function. Thus, the structure of such shielding base member becomes complicated and also incorporates the plastic film. As a result, there remain the problems that the optical transmittance of the shielding base member is further lowered and that the haze (degree of opaque) is further increased.

SUMMARY OF THE INVENTION

It is an object of the present invention to provide a shielding base member with high optical transmittance and low haze (degree of opaqueness), and a method of manufacturing the same.

Also, it is another object of the present invention to provide a method of manufacturing a shielding base member having an adhesive layer without denting.

The present invention provides a shielding base member manufacturing method which comprises the steps of forming a structure, in which a first adhesive layer, a resin layer, and a metal foil are laminated sequentially on a release layer of a plastic film that has the release layer at one surface, forming a metal layer pattern by patterning the metal foil, and forming the first adhesive layer, the resin layer, and the metal layer pattern, in this order, on a transparent substrate by separating the release layer from the first adhesive layer along an interface and then pasting the first adhesive layer onto the transparent substrate.

As described above, since the handling of the metal foil that is patterned is not easy, the metal foil is pasted onto the plastic film via the resin layer and then the plastic film having the metal foil thereon is pasted onto a transparent substrate such as a glass substrate having strong rigidity. As a result, the plastic film whose optical transmittance is low and whose haze (degree of opaqueness) is high remains in the shielding base member.

The shielding base member manufacturing method of the present invention does not leave the plastic film in the shielding base member.

More particularly, first the adhesive layer, the resin layer, and the metal foil are formed on the surface of a plastic film on which a release layer is formed. Then, the metal layer pattern is formed by patterning the metal foil.

Since the metal foil is supported on the plastic film via the adhesive layer and the resin layer, the plastic film has rigidity and thus the handling of the metal foil can be facilitated. Accordingly, there is no need to form a pattern in the metal foil after this plastic film is pasted onto the transparent substrate. As a result, the roll-like plastic film onto which the metal foil is pasted is extended and then the metal foil can be patterned by the so-called roll-to-roll method.

After the release layer formed on the plastic film is separated from the first adhesive layer along the interface, the first adhesive layer, the resin layer, and the patterned metal layer are pasted onto a transparent substrate such as a glass substrate.

Thus, the shielding base member is free of a plastic film whose optical transmittance is low and whose haze is high.

As described above, according to the shielding base member manufacturing method of the present invention, the patterning of the metal foil can be carried out by the roll-to-roll method and thus the production efficiency of the shielding base member can be improved. Also, since the plastic film is not left in the shielding base member, a shielding base member whose optical transmittance is high and whose haze is low can be easily manufactured.

Also, the present invention provides a shielding base member manufacturing method which comprises the steps of forming a structure in which a first adhesive layer, a resin layer, and a metal foil are laminated in sequence, on a release layer of a plastic film, separating the release layer from the first adhesive layer along an interface and then pasting the first adhesive layer onto the transparent substrate, and forming a metal layer pattern by patterning the metal foil.

According to the present invention, first the first adhesive layer, the resin layer, and the metal layer are formed on the plastic film via the release layer, then the release layer is separated from the first adhesive layer along the interface, and then the first adhesive layer, the resin layer, and the metal layer are pasted onto the transparent substrate. Then, a metal layer pattern is formed in the metal layer on the transparent substrate.

According to the above embodiment of the shielding base member manufacturing method, the metal layer pattern is formed by patterning the metal foil, which is formed over the plastic film, by the roll-to-roll method. In contrast, according to another embodiment of the present invention, the first adhesive layer, the resin layer, and the metal layer are transferred onto the transparent substrate, and then the metal layer is patterned. Also, if a substrate having a strong rigidity such as a glass substrate, for example, is employed as the transparent substrate, stable metal layer patterns can be formed.

Also, the present invention provides a shielding base member manufacturing method which comprises the steps of preparing a first plastic film including a first adhesive layer, a resin layer, and a metal foil in sequence on a surface, forming a metal layer pattern by patterning the metal foil, forming the resin layer and metal layer pattern on a second adhesive layer of a second plastic film, which has a release layer and the second adhesive layer sequentially formed on a surface, by separating the first adhesive layer from the resin layer along an interface, then pasting a surface of the second adhesive layer of the second plastic film onto a surface of the resin layer, separating the release layer from the second adhesive layer along an interface and then pasting a surface of the second adhesive layer onto the transparent substrate.

In the present invention, first the first plastic film that has the sequence of the first adhesive layer, the resin layer, and the metal foil formed on its surface is prepared, and then the metal layer patterns are formed by patterning the metal foil. If the roll-to-roll method is employed for the purpose of improving the production efficiency, dents are easily generated in the first adhesive layer by foreign matter, or the like when the first plastic film is wound on the roll. Then, the first transfer body consisting of the resin layer and the metal layer patterns formed thereon is obtained by separating the first adhesive layer of the first plastic film from the resin layer along the interface.

Then, the second plastic film having the release layer and the second adhesive layer formed in sequence from the bottom is prepared. Then, the exposed surface of the second adhesive layer is pasted onto the surface of the resin layer, on which metal layer pattern is formed, in the first transfer body. Accordingly, the resin layer and the metal layer pattern are formed on the second adhesive layer of the second plastic film. That is, the new second adhesive layer in which the dent defect is not generated is formed under the resin layer in place of the first adhesive layer in which the dent defect is generated.

Then, the second adhesive layer is separated from the resin layer along the interface to form a second transfer sheet consisting of the second adhesive layer, the resin layer, and the metal layer pattern sequentially from the bottom. Then, the exposed surface of the second adhesive layer of this second transfer sheet is pasted onto one surface of the glass substrate to form a shielding base member that has no dents.

As described above, according to the present invention, since the plastic film does not remain in the shielding base member, a shielding base member having high optical transmittance and low haze can be easily manufactured. Also, since the metal foil is formed on the first plastic film having the first adhesive layer and high rigidity, the metal foil can be patterned by the roll-to-roll method while expanding the plastic film, and thus the production efficiency can be improved.

In addition, even if dents form in the first adhesive layer at this time, the first adhesive layer can be replaced by the new second adhesive layer in later steps. Since the roll-to-roll method is not needed in the step after the second adhesive layer is formed, the shielding base member can be manufactured without winding the second adhesive layer on the roll. Therefore, no dent is formed in the second adhesive layer of the shielding base member, and thus a shielding base member of high quality can be manufactured with high yield.

Also, the present invention provides a shielding base member manufacturing method which comprises the steps of preparing a first plastic film including a first adhesive layer, a resin layer, and a metal foil sequentially on a surface, forming a metal layer pattern by patterning the metal foil, forming a resin layer and the metal layer pattern on a second adhesive layer of a second plastic film, which has a release layer, separating the first adhesive layer from the resin layer along an interface and then pasting a surface of the second adhesive layer of the second plastic film onto a surface of the resin layer, and separating the release layer from the second adhesive layer along an interface. In this embodiment, unlike the previously described method embodiments, the shielding base member is not formed by pasting the second transfer body (the second adhesive layer, the resin layer, and the metal layer patterns) onto a transparent substrate, but the member consisting of the second adhesive layer, the resin layer, and the metal layer pattern is used as the shielding base member by exposing the surface of the second adhesive layer and pasting that exposed surface directly onto the display screen of the PDP.

The present invention also provides a shielding base member which comprises a transparent substrate, a first adhesive layer formed on the transparent substrate; a resin layer formed on the first adhesive layer, a metal layer pattern formed on the resin layer, and a reflection preventing layer formed on the metal layer pattern and the resin layer via a third adhesive layer.

The shielding base member of the present invention is the shielding base member manufactured by any of the above-described manufacturing methods. Since this shielding base member does not contain the plastic film whose optical transmittance is low and whose haze is high, the visibility of the PDP can be improved when such a shielding base member is employed as the shielding base member of the PDP.

Also, the present invention provides a shielding base member which comprises a transparent substrate, a first adhesive layer formed on the transparent substrate, a resin layer formed on the first adhesive layer and having at least a near-infrared absorbing function, a metal layer pattern formed on the resin layer, and a filter layer formed on the metal layer pattern and the resin layer via a second adhesive layer and having at least a reflection preventing function.

According to the present invention, the plastic film employed as the substrate that facilitates the handling of the metal foil does not remain in the shielding base member. The near-infrared absorbing function is provided by incorporating a pigment material, that absorbs a predetermined wavelength of the near-infrared portion of the spectrum, into the resin layer. Therefore, unlike the related art, there is no need to separately form the plastic film having the near-infrared absorbing function.

DESCRIPTION OF THE PREFERRED EMBODIMENTS

Embodiments of the present invention will be explained with reference to the drawings hereinafter.

First Embodiment

Manufacturing methods for producing the shielding base member according to the first embodiment of the present invention will first be described.

First Manufacturing Method

Figure 1A:
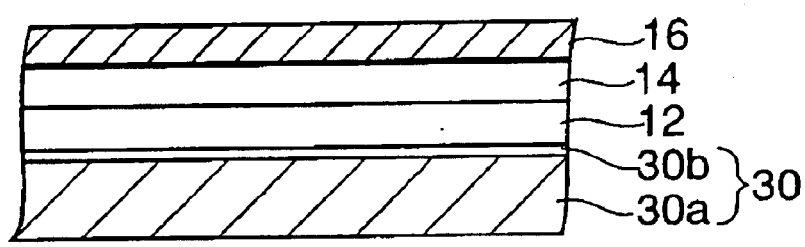
FIG. 1A to FIG. 1D are schematic sectional views showing a first method for manufacturing a shielding base member according to a first embodiment of the present invention.

As shown in FIG. 1A, a PET (polyethylene terephthalate) film 30a is used as an example of the plastic film. A silicone layer 30b (release layer) of 1 $\mu$m, for example, is coated on one surface of this PET film 30a.

To form the silicone layer 30b a solution of 600 wt % in total is formed by mixing 100 parts by weight of the silicone (KS-3703 manufactured by Shin-Etsu Chemical Co., Ltd.), 1 part by weight of the catalyst (CAT-PL-50T), and 499 parts by weight of solvent (toluene). Then, the silicone layer 30b is formed by coating this solution on the PET film 30a by a bar coater, and then annealing at 120° C. for 30 seconds: This plastic film 30a on one surface of which the silicone layer 30b is formed is referred to as "separator 30" hereinafter.

Then, a first adhesive layer 12 having a thickness of 10 to 50 $\mu$m, preferably 25 $\mu$m, for example, is formed on the surface of the separator 30, on which the silicone layer 30b is formed.

Then, a copper foil 16 (metal foil) of 10 $\mu$m thickness, for example, is prepared. The bright surface of this copper foil 16 is blackened by immersing the copper foil 16 in a mixed solution consisting of a copper pyrophosphate aqueous solution, a potassium pyrophosphate aqueous solution, and an ammonia aqueous solution, for example, with electrolytic plating at a current density of 5 A/cm$^2$ for 10 seconds.

Then, a resin layer 14 is formed on the first adhesive layer 12. The copper foil 16 is placed on the resin layer 14 with its blackened surface opposite the resin layer 14 side, and then is adhered to the resin layer 14 by baking at 80° C. for 20 seconds and pressing under 5 kg/cm$^2$, for example.

The resulting structure has the first adhesive layer 12, the resin layer 14, and the copper foil 16 laminated on the separator 30 in sequence. Since not only the resin layer 14 but also the first adhesive layer 12 is formed between the separator 30 and the copper foil 16, the rigidity of the separator 30 can be enhanced.

Figure 1B:
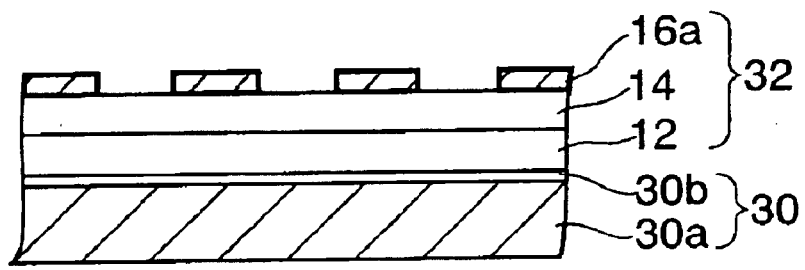

Then, as shown in FIG. 1B, a resist film (not shown) is formed on the copper foil 16 by the roll-to-roll method and then the copper foil 16 is etched by spraying with an iron (III) chloride aqueous solution, for example, using the resist film as a mask. Thus, copper layer pattern 16a is formed as a mesh, for example.

The presence of the first adhesive layer 12 between the separator 30 and the copper foil 16 enhances the rigidity and, accordingly, the separator 30 can withstand the pressure of the sprayed etchant and the copper foil 16 can be stably etched. Also, in the case of the structure in which the first adhesive layer 12 is exposed after the copper foil 16 is etched, i.e., in the case of the structure from which the resin layer 14 is omitted, the first adhesive layer 12 is changed from transparent to a yellow color by the etchant. However, in the present embodiment, since the cured resin layer 14 is present on the first adhesive layer 12, the transparency of the first adhesive layer 12 can be maintained.

Then, the exposed surface of the copper layer pattern 16a is blackened by using a mixed solution consisting of a chlorite soda aqueous solution and a caustic soda aqueous solution. Since the surface of the copper foil 16 on the resin layer 14 side is blackened in the above step, all surfaces and side surfaces of the copper layer pattern 16a are blackened when this step is finished.

In this manner, as shown in FIG. 1B, a transfer sheet 32 consisting of the first adhesive layer 12, the resin layer 14, and the copper layer pattern 16a is formed on the separator 30.

Figure 1C:
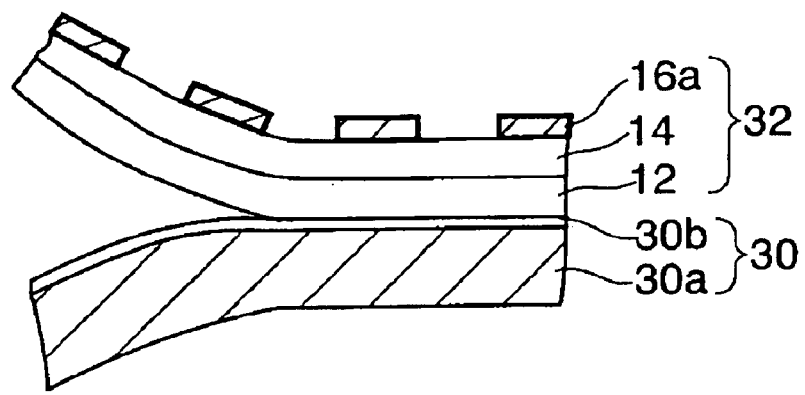

Then, as shown in FIG. 1C, the separator 30 and the first adhesive layer 12 are separated along their interface. At this time, since the adhesive strength between the silicone layer 30b and the first adhesive layer 12 is weaker than that between the silicone layer 30b and the PET film 30a, the transfer sheet 32 can be easily separated along the interface between the separator 30 and the first adhesive layer 12.

Figure 1D:
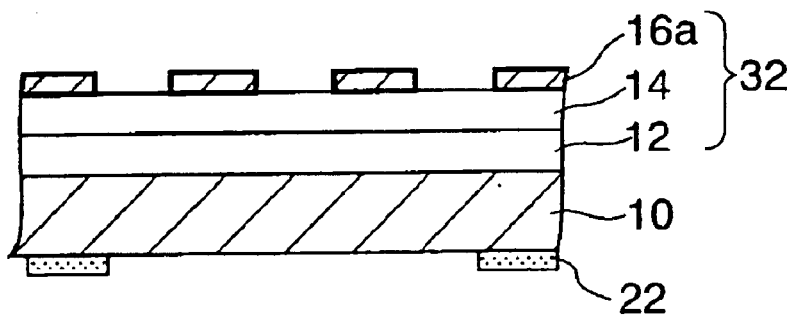

Then, as shown in FIG. 1D, a transparent glass substrate 10 (transparent substrate), on a peripheral portion of one surface of which a black frame layer 22 is formed, is prepared. The exposed surface of the first adhesive layer 12 is then pasted onto the surface of the glass substrate 10, with the black frame layer 22 omitted. Accordingly, the transfer sheet 32 that consists of the first adhesive layer 12, the resin layer 14, and the copper layer pattern 16a, in this sequence, is formed on the glass substrate 10.

Figure 3A:
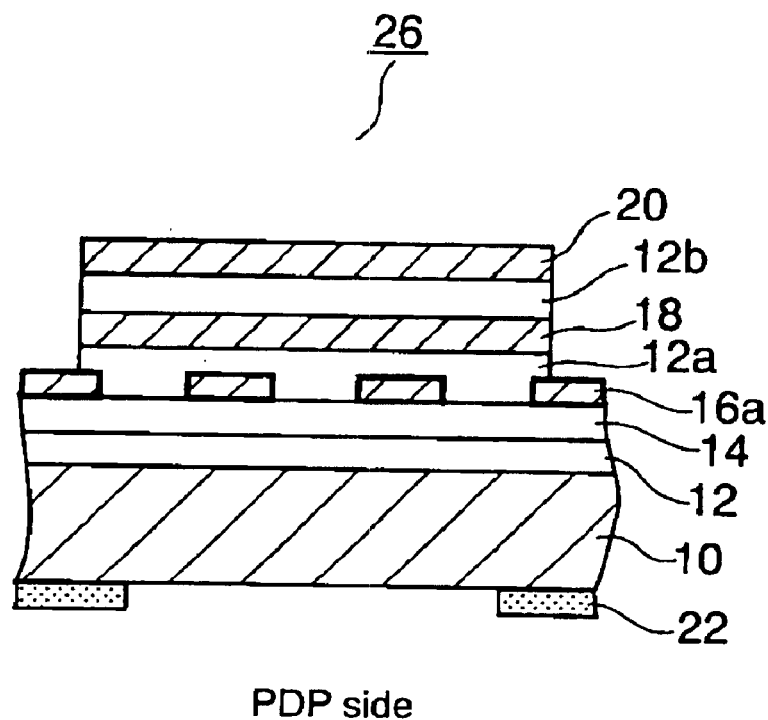
FIG. 3A is a schematic sectional view showing the shielding base member according to the first embodiment of the present invention.

Then, as shown in FIG. 3A, a second adhesive layer 12a having a color correcting function is formed on the copper layer pattern 16a and the resin layer 14 such that the copper layer pattern 16a on the peripheral portion is exposed. Then, a near-infrared absorbing layer 18 is formed on this second adhesive layer 12a.

A third adhesive layer 12b having an ultraviolet (UV) absorbing function is then formed on the near-infrared absorbing layer 18. A PET reflection preventing layer 20 is formed on the third adhesive layer 12b by using a PET film with a reflection preventing layer formed on one surface thereof.

Second Manufacturing Method

The second manufacturing method differs from the first manufacturing method in that metal patterns are formed by patterning after the metal layer is transferred onto the glass substrate. Therefore, in FIG. 2A to FIG. 2D, the same symbols are affixed to the same elements as those in FIG. 1A to FIG. 1D, and their detailed explanation will be omitted herein.

Figure 2A:
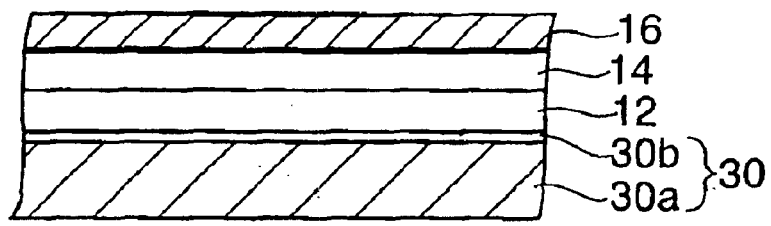
FIG. 2A to FIG. 2D are schematic sectional views showing a second method for manufacturing a shielding base member according to the first embodiment of the present invention.

First, as shown in FIG. 2A, in the same manner as the first manufacturing method, a structure in which the first adhesive layer 12, the resin layer 14, and the copper foil 16, the surface of which on the resin layer 14 side is subjected to the blackening process, are formed on the separator 30.

Figure 2B:
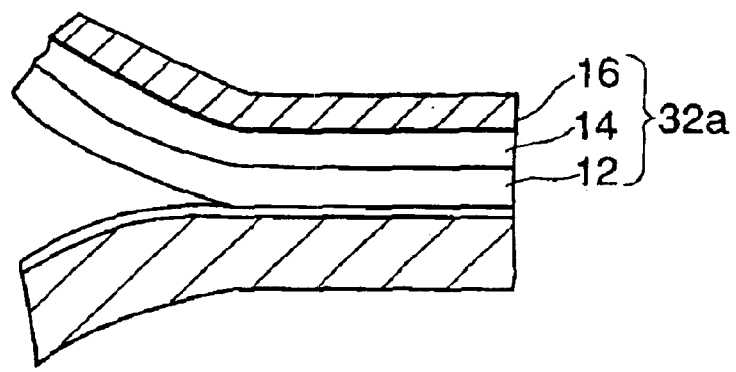
Figure 2C:
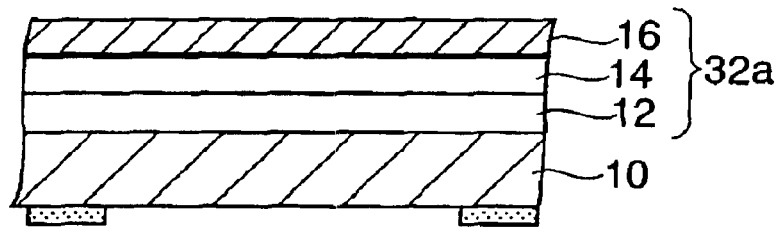

Then, as shown in FIGS. 2B and 2C, in the same manner as in the first manufacturing method, the silicone layer 30b and the first adhesive layer 12 are separated along their interface, and then the first adhesive layer 12 is pasted onto the surface of the glass substrate 10, without the black frame layer. Thus, a transfer sheet 32a that consists of the first adhesive layer 12, the resin layer 14, and the copper foil 16, in this sequence, is formed on the glass substrate 10.

Figure 2D:
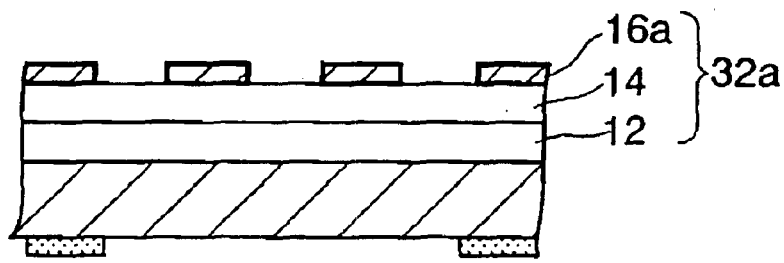

Then, as shown in FIG. 2D, the copper layer patterns 16a are formed by patterning the resist film (not shown) on the copper foil 16 and etching the copper foil 16 with an iron (III) chloride aqueous solution, for example, while using the resist film as a mask.

In the second manufacturing method, the first adhesive layer 12, the resin layer 14, and the copper foil 16 are transferred onto the glass substrate 10, and then the copper layer pattern 16a is formed by patterning the copper foil 16. Since the copper foil is patterned while on the highly rigid glass substrate, the precision of the patterning of the resist film is increased and therefore the finer copper layer patterns can be stably formed.

Then, blackening of the side surfaces of the copper pattern 16a is effected by the same method used in the first manufacturing method.

Accordingly, as shown in FIG. 2D, a structure similar to that in FIG. 1D is formed, i.e., the first adhesive layer 12, the resin layer 14, and the copper layer pattern 16a is formed sequentially from the glass substrate.

Then, as shown in FIG. 3A, the near-infrared absorbing layer 18 is formed on the copper layer pattern 16a and the resin layer 14 via a second adhesive layer 12a having a color correcting function by the same method as the first manufacturing method. Then, a PET reflection preventing layer 20 is formed on the near-infrared absorbing layer 18 via a the third adhesive layer 12b having an ultraviolet (UV) absorbing function, to complete the shielding base member 26.

In the shielding base member 26 of the present embodiment, as shown in FIG. 3A, the mesh-like copper layer pattern 16a, for example, is formed on one surface of the glass substrate 10 via the first adhesive layer 12 and the resin layer 14. All surfaces of the copper pattern 16a are blackened to eliminate the metal luster and to exhibit a blackish color.

Then, the near-infrared absorbing layer 18 is formed on the copper pattern 16a and the resin layer 14 via the second adhesive layer 12a, and then the PET reflection preventing layer 20 is formed on the near-infrared absorbing layer 18 via the third adhesive layer 12b. The ultraviolet (UV) absorber is incorporated into the third adhesive layer 12b formed directly under the PET reflection preventing layer 20, and thus the third adhesive layer 12b has the ultraviolet (UV) absorbing function. Also, for example, the second adhesive layer 12a has the color correcting function. In this case, at least one of the first, second, and third adhesive layers 12, 12a, 12b may have the color correcting function.

The second adhesive layer 12a, the near-infrared absorbing layer 18, the third adhesive layer 12b, and the PET reflection preventing layer 20 are formed to leave exposed a peripheral portion of the copper pattern 16a. The copper pattern 16a exposed at the peripheral portion of the glass substrate 10 is connected to the ground circuit of the PDP to prevent it from carrying a charge.

The black frame layer 22 is formed on the peripheral portion of the other surface of the glass substrate 10. In this case, the black frame layer 22 may be formed on the peripheral portion of one surface of the glass substrate 10, i.e., on the peripheral portion of the glass substrate 10 on the first adhesive layer 12 side. Optionally, the black frame layer 22 may be omitted.

The shielding base member 26 is arranged on the PDP such that the copper layer pattern 16a formed on the peripheral portion of the glass substrate 10 is connected electrically to the ground terminal of the casing of the PDP, the surface of the glass substrate 10 on the black frame layer 22 side is directed to the display screen side of the PDP, and the surface of the glass substrate 10 on the first adhesive layer 12 side is directed to the viewer side of the PDP. Since the copper layer pattern 16a is a good conductor, the electromagnetic radiation such as microwave, ultra low frequency radiation, etc., emitted from the display screen of the PDP can be shielded.

The manufacturing methods for producing the shielding base member 26 of the present embodiment are designed so as not to leave the PET film 30a, whose optical transmittance is low and whose haze (degree of opaqueness) is high, in the shielding base member 26. Thus, the separator 30, in which the silicone layer 30b is formed as a release layer on the PET film 30a, is employed so that the PET film 30a can be easily separated from the transfer sheet 32 or 32a that consists of the first adhesive layer 12, the resin layer 14, and the copper layer pattern 16a or the copper foil 16 formed on the PET film 30a.

More particularly, in the first manufacturing method, rigidity is increased by pasting the copper foil 16, which is not easily handled, onto the separator 30 via the first adhesive layer 12 and the resin layer 14, and then the copper layer pattern 16a is formed by etching the copper foil with the roll-like separator 30 unrolled.

Then, since the silicone layer 30b is formed at the interface between the separator 30 and the first adhesive layer 12, the separator 30 can be easily separated from the first adhesive layer 12 along this interface. Therefore, the transfer sheet 32 that consists of the first adhesive layer 12, the resin layer 14, and the copper layer pattern 16a can be adhered to the glass substrate 10.

In doing this, the copper foil 16 can be patterned while on the separator 30 by the so-called roll-to-roll method and thus the production efficiency can be improved.

In the second manufacturing method, after the first adhesive layer 12, the resin layer 14, and the copper foil 16 are transferred onto the glass substrate 10, the copper layer pattern 16a is formed in the copper foil 16. Also, in this second manufacturing method, the shielding base member without the PET film 30a can be easily manufactured.

In this manner, the shielding base member 26 of the present embodiment is free of PET film other than the PET reflection preventing layer 20. Therefore, the optical transmittance of the shielding base member can be increased and also the haze can be reduced.

Also, the shielding base member 26 of the present embodiment has the PET reflection preventing layer 20 to suppress the reflection of light from the outside. Therefore, the electromagnetic radiation can be shielded and also the contrast ratio of the display screen of the PDP can be improved. In addition, since the reflection preventing layer 20 is formed of PET film, the adhesiveness between the PET reflection preventing layer 20 and the third adhesive layer 12b is improved.

In addition, since the shielding base member 26 of the present embodiment has a near-infrared absorbing function, there is no possibility of malfunction if a remote control unit, or the like is operated near the PDP.

Further, since the shielding base member 26 of the present embodiment has the ultraviolet (UV) absorbing function, the ultraviolet rays that are harmful to the human body can be blocked. Furthermore, since the shielding base member 26 of the present embodiment has a color correcting function, the luminous intensity in the concerned color can be corrected even if the light emission in some color in the PDP is enhanced. For example, because a mixed gas consisting of xenon and neon is employed in the color PDP as a discharge medium, the orange color light emission of the neon acts as one factor to lower the color display performance of the PDP. Therefore, in the shielding base member 26 of the present embodiment, color correction of the PDP color display can be achieved by incorporating a pigment of a color which can suppress the light emission of the neon, for example, in the adhesive layer.

Next, a variation of the method of manufacturing the shielding base member according to the present embodiment will be explained hereunder.

First, the structure shown in FIG. 1D is manufactured by the first method, or the structure shown in FIG. 2D is manufactured by the second method.

Figure 3B:
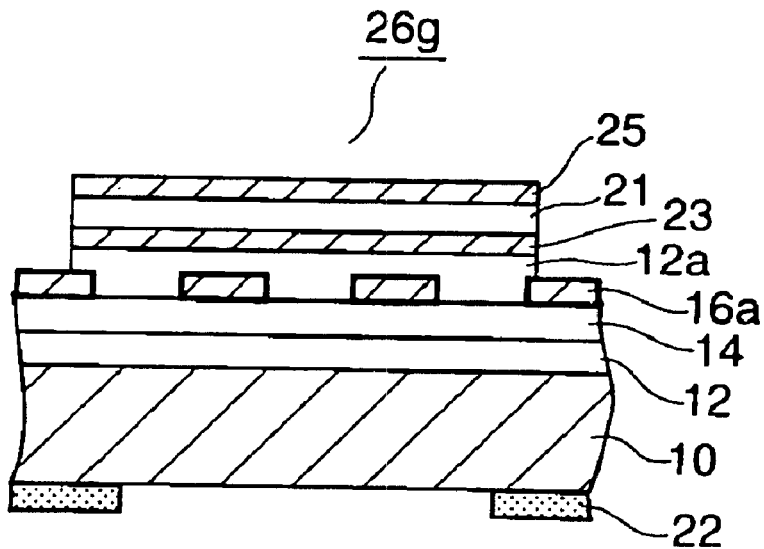
FIG. 3B is a schematic sectional view showing a variation of the shielding base member according to the first embodiment of the present invention.

Then, as shown in FIG. 3B, a PET film 21 is prepared, and then a reflection preventing layer 25 is formed on one surface of this PET film 21 and also a near-infrared absorbing layer 23 is formed on the other surface of this PET film 21. Thus, a plastic film 21 that has the reflection preventing function on one surface and has the near-infrared absorbing function on the other surface is prepared.

Then, as shown in FIG. 3B, the second adhesive layer 12a is formed on the copper layer pattern 16a and the resin layer 14. Then, the surface of the PET film 21 on the near-infrared absorbing layer 23 side is adhered to the glass substrate 10 via this second adhesive layer 12a. Accordingly, as shown in FIG. 3B, the PET film 21, having the near-infrared absorbing layer 23 formed on one surface and the reflection preventing layer 25 formed on the other surface, is substituted for the combination of the near-infrared absorbing layer 18, the third adhesive layer 12b, and the PET reflection preventing layer 20, which are formed on the second adhesive layer 12a in FIG. 3A.

According to the variation described above, a shielding base member 26g having substantially the same functions as the previously described shielding base member can be obtained and thus similar effects can be achieved. Also, since the PET film having the near-infrared absorbing function and the reflection preventing function is pasted onto the glass substrate having the copper layer pattern, the manufacture of the shielding base member 26g is easier than that of the shielding base member 26 and also the structure thereof can be simplified.

Second Embodiment

Figure 4:
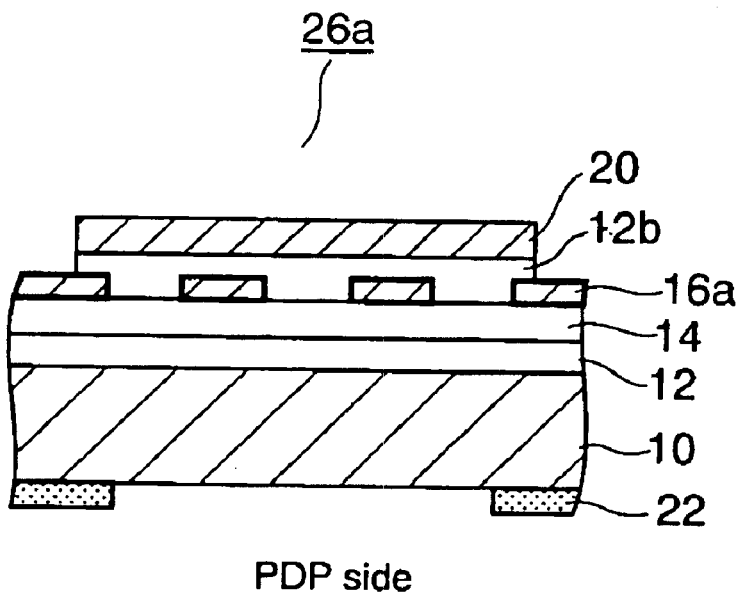
FIG. 4 is a schematic sectional view showing a shielding base member according to a second embodiment of the present invention.

FIG. 4 is a schematic sectional view showing a shielding base member according to a second embodiment of the present invention. The shielding base member of the second embodiment differs from the shielding base member of the first embodiment in that it has no separate near-infrared absorbing layer and such function is given to the adhesive layer. Therefore, in FIG. 4, the same symbols are affixed to the same elements as those in FIG. 3A, and their detailed explanation will be omitted here.

As shown in FIG. 4, the shielding base member 26a of the second embodiment has a structure lacking a separate near-infrared absorbing layer. The copper layer pattern 16a is formed on the glass substrate 10 via the first adhesive layer 12 and the resin layer 14, and then the PET reflection preventing layer 20 is formed on the copper layer pattern 16a via the third adhesive layer 12b having the near-infrared absorbing function. In this manner, since the third adhesive layer 12b has the near-infrared absorbing function, there is no need for a separate near-infrared absorbing layer.

Also, at least one of the first adhesive layer 12 and the third adhesive layer 12b has the ultraviolet (UV) absorbing function. In addition, at least one of the first adhesive layer 12 and the third adhesive layer 12b has the color correcting function.

In this case, the near-infrared absorbing function may be provided by the first adhesive layer 12 instead of the third adhesive layer 12b, otherwise both layers may have the near-infrared absorbing function. Also, the black frame layer 22 may be omitted.

The shielding base member 26a of the present embodiment can be manufactured by the same manufacturing method as the shielding base member of the first embodiment.

The shielding base member 26a of the present embodiment provides similar effects to those of the shielding base member 26 of the first embodiment. Also, since there is no need for a separate near-infrared absorbing layer, the manufacture of the shielding base member of the present embodiment is easier. In addition, since the near-infrared absorbing layer is omitted and the optical transmittance can be improved accordingly, the visibility of the PDP is improved over that having the shielding base member 26 of the first embodiment.

Third Embodiment

Figure 5:
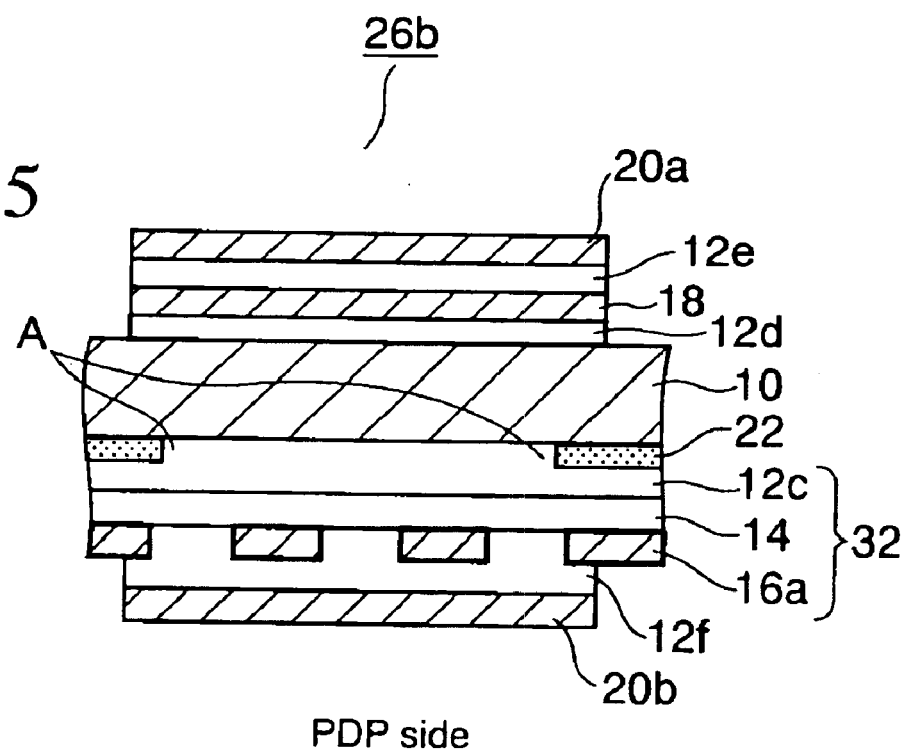
FIG. 5 is a schematic sectional view showing a shielding base member according to a third embodiment of the present invention.

FIG. 5 is a schematic sectional view showing a shielding base member according to a third embodiment of the present invention. The difference between the shielding base member of the third embodiment and the shielding base member of the first embodiment is that in the third embodiment the metal layer pattern of the shielding base member is formed on the surface of the transparent substrate on the PDP side and reflection preventing layers are formed on both surfaces of the transparent substrate. Therefore, in FIG. 5, the same symbols are affixed to the same elements as those in FIG. 3A, and their detailed explanation is omitted here.

As shown in FIG. 5, in the shielding base member 26b of the third embodiment, the black frame layer 22 is formed on one surface of the glass substrate 10, i.e., the surface on the PDP side, and the copper layer pattern 16a is formed on the black frame layer 22 and the glass substrate 10 via a first adhesive layer 12c and the resin layer 14.

The near-infrared absorbing layer 18 is formed on the other surface of the glass substrate 10 via a second adhesive layer 12d, and also a first PET reflection preventing layer 20a is formed on this near-infrared absorbing layer 18 via a third adhesive layer 12e. Then, a second PET reflection preventing layer 20b is formed on the copper layer pattern 16a via a fourth adhesive layer 12f.

In this case, the near-infrared absorbing layer 18 may be formed between a fourth adhesive layer 12f and the second PET reflection preventing layer 20b, and the second PET reflection preventing layer 20b may be formed on the near-infrared absorbing layer 18 via the second adhesive layer 12d. Also, instead of provision of the near-infrared absorbing layer 18 and the second adhesive layer 12d, the near-infrared absorbing layer may be coated on the surface of the second PET reflection preventing layer 20b on the PDP side.

In the shielding base member 26b of the third embodiment, the first PET reflection preventing layer 20a is formed on the surface of the glass substrate 10 on the PDP operator side, and the second PET reflection preventing layer 20b is formed on the surface of the glass substrate 10 on the PDP side. Neither the first PET reflection preventing layer 20a nor the second PET reflection preventing layer 20b has an ultraviolet (UV) absorbing function. Alternatively, at least one of the first, second, third, and fourth adhesive layers 12c, 12d, 12e, 12f may have an ultraviolet (UV) absorbing function. It is preferable that the third adhesive layer 12e should have the ultraviolet (UV) absorbing function.

Also, at least one of the first, second, third, and fourth adhesive layers 12c, 12d, 12e, 12f has a color correcting function. It is preferable that the second adhesive layer 12d should have the color correcting function. Optionally, the black frame layer 22 may be omitted.

The shielding base member 26b of the third embodiment provides effects similar to those of the shielding base member of the first embodiment. Also, since the first PET reflection preventing layer 20a and the second PET reflection preventing layer 20b are formed on the surfaces of the shielding base member on the PDP operator side and the PDP side, respectively, the reflection of the light irradiated from the outside and the reflection of the light emitted from the display screen of the PDP are suppressed and thus the contrast ratio of the display screen of the PDP is improved.

Also, the shielding base member 26b of the third embodiment has the copper layer pattern 16a formed on the surface of the glass substrate 10, on which the black frame layer 22 is formed, via the first adhesive layer 12c and the resin layer 14. Here, assuming the case where the PET film 30a still remains between the first adhesive layer 12c and the resin layer 14, since the PET film 30a has rigidity to some extent, the first adhesive layer 12c is pulled toward the PET film 30a side so as not to enter into stepped portions (areas "A" in FIG. 5) at pattern edges of the black frame layer 22, and thus bubbles are readily formed in these stepped portions. Accordingly, lines due to the bubbles are generated along the pattern edges of the black frame layer 22, and thus the appearance of the PDP is damaged and its visibility is reduced.

However, according to the present embodiment, since the PET film 30a is not present, the first adhesive layer 12c fills in the stepped portions (areas "A" in FIG. 5) at the pattern edges of the black frame layer 22 and buries the stepped portions. As a result, the lines due to bubbles are not seen along the pattern edges of the black frame layer 22, and thus the appearance of the PDP and its visibility are maintained.

Next, the method of manufacturing the shielding base member 26b of the third embodiment will be explained.

First, in the same way as in the first manufacturing method of the first embodiment, the transfer sheet 32 consisting of the first adhesive layer 12c, the resin layer 14, and the copper layer pattern 16a, which are formed on the separator 30, is separated from the separator 30 and then adhered to one surface of the glass substrate 10, on which the black frame layer 22 is formed. Because no PET film is included in the transfer sheet 32, the transfer sheet 32 can be adhered to the glass substrate 10 such that the first adhesive layer 12c follows the stepped portions A of the black frame layer 22 and fills in the stepped portions A.

Otherwise, in the same way as the second manufacturing method of the first embodiment, the transfer sheet 32a, consisting of the first adhesive layer 12c, the resin layer 14, and the copper foil 16, which are formed on the separator 30, is separated from the separator 30 and then pasted onto one surface of the glass substrate 10, on which the black frame layer 22 is formed.

Then, if the second manufacturing method is employed, the copper layer pattern 16a is formed by patterning the copper foil 16 over the glass substrate 10. The second PET reflection preventing layer 20b is formed on the copper layer pattern 16a and the resin layer 14 via the fourth adhesive layer 12f. Then, the near-infrared absorbing layer 18 is formed on the other surface of the glass substrate 10 via the second adhesive layer 12d, and then the first PET reflection preventing layer 20a is formed on the near-infrared absorbing layer 18 via the third adhesive layer 12e, to complete the shielding base member 26b of the third embodiment.

Fourth Embodiment

Figure 6:
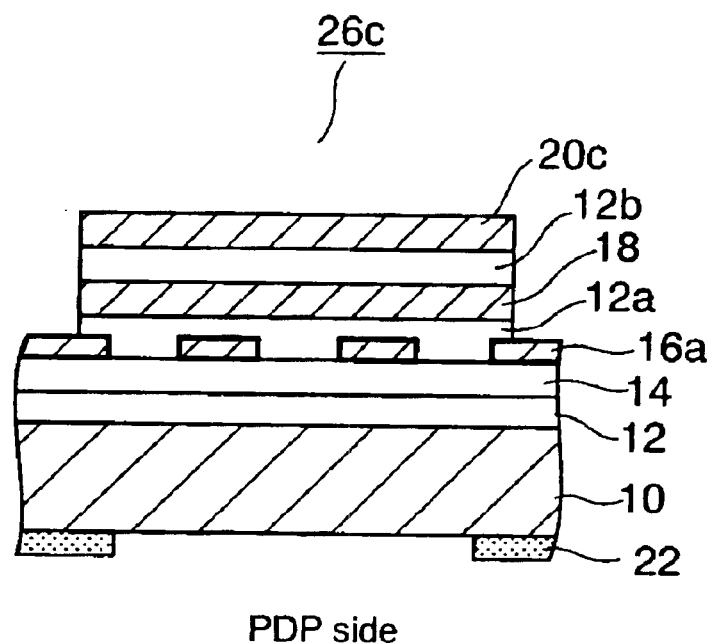
FIG. 6 is a schematic sectional view showing a shielding base member according to a fourth embodiment of the present invention.

FIG. 6 is a schematic sectional view showing a shielding base member according to a fourth embodiment of the present invention. The shielding base member of the fourth embodiment is formed by using a different material for the reflection preventing layer in the shielding base member of the first embodiment. Therefore, in FIG. 6, the same symbols are affixed to the same elements as those in FIG. 3A, and their detailed explanation is omitted here.

The difference between the shielding base member 26c of the fourth embodiment and the shielding base member 26 of the first embodiment is that, as shown in FIG. 6, a TAC (triacetylcellulose) film is employed in place of the PET film as a reflection preventing layer 20c. Since this TAC reflection preventing layer 20c also has an ultraviolet (UV) absorbing function, there is no need for the third adhesive layer 12b, for example, to have an ultraviolet (UV) absorbing function.

Also, like the shielding base member 26 of the first embodiment, at least one of the first, second, and third adhesive layers 12, 12a, 12b has a color correcting function. In this case, the black frame layer 22 may be omitted. Also, like the variation of the shielding base member of the first embodiment, the TAC film may have a reflection preventing layer on one surface and a near-infrared absorbing layer on its other surface to allow omission of the near-infrared absorbing layer 18, the third adhesive layer 12b, and the TAC reflection preventing layer 20c. The surface of the near-infrared absorbing layer of this TAC film may be adhered to the second adhesive layer 12a over the glass substrate 10.

With the shielding base member 26c of this fourth embodiment, since the TAC reflection preventing layer 20c is employed as the reflection preventing layer, the optical transmittance of the shielding base member can be improved over that of the first embodiment in which the PET reflection preventing layer is employed. As a result, the visibility of the PDP can be improved over that of the shielding base member 26b of the first embodiment.

Fifth Embodiment

Figure 7:
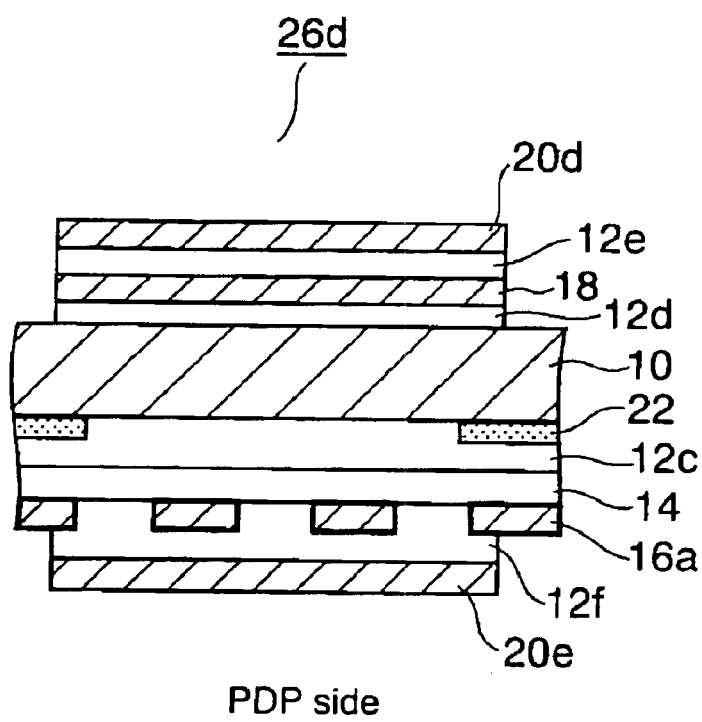
FIG. 7 is a schematic sectional view showing a shielding base member according to a fifth embodiment of the present invention.

FIG. 7 is a schematic sectional view showing a shielding base member according to a fifth embodiment of the present invention. The shielding base member of the fifth embodiment is formed by using a different material for the reflection preventing layer in the shielding base member of the third embodiment. Therefore, in FIG. 7, the same symbols are affixed to the same elements as those in FIG. 5, and their detailed explanation is omitted here.

The difference between the shielding base member 26d of the present embodiment and the shielding base member 26b of the third embodiment is that, as shown in FIG. 7, a TAC film is employed instead of a PET film as the reflection preventing layer. In other words, a first TAC reflection preventing layer 20d, i.e., a TAC film having a reflection preventing layer, is formed on the surface of the glass substrate 10 on the PDP operator side, and a second TAC reflection preventing layer 20e is similarly formed on the surface of the glass substrate 10 on the PDP side.

Also, at least one of the first TAC reflection preventing layer 20d and the second TAC reflection preventing layer 20c has an ultraviolet (UV) absorbing function. None of the first, second, third and fourth adhesive layers 12c, 12d, 12e, 12f has an ultraviolet (UV) absorbing function.

Also, at least one of the first, second, third and fourth adhesive layers 12c, 12d, 12e, 12f has a color correcting function. It is preferable that the second adhesive layer 12d has the color correcting function. In this case, the black frame layer 22 may be omitted.

According to the shielding base member 26d of the present embodiment, the first and second TAC reflection preventing layers 20d, 20e can improve the optical transmittance in contrast to the PET reflection preventing layer. Therefore, the visibility of the PDP can be improved over that of the shielding base member 26b of the third embodiment.

Sixth Embodiment

Figure 8A:
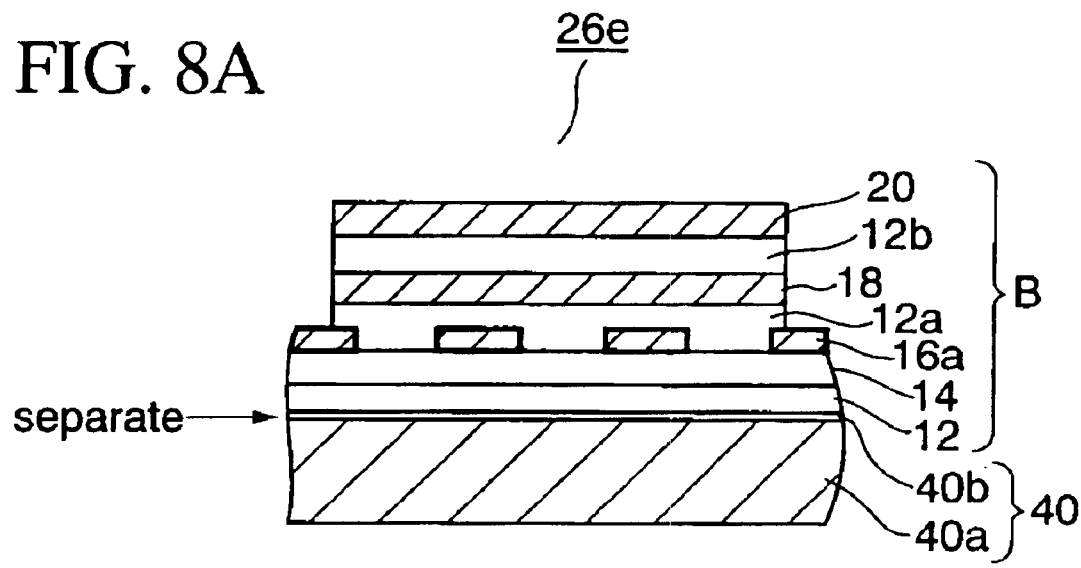
FIG. 8A is a schematic sectional view showing a shielding base member according to a sixth embodiment of the present invention.
Figure 8B:
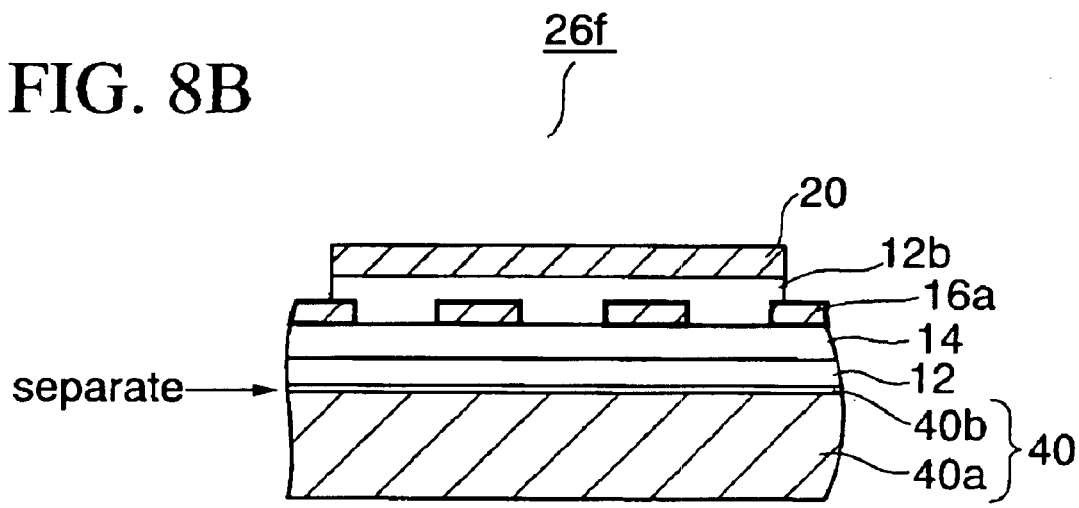
FIG. 8B is a schematic sectional view showing a variation of the shielding base member according to the sixth embodiment of the present invention.

FIG. 8A and FIG. 8B are schematic sectional views showing a shielding base member according to a sixth embodiment of the present invention. Unlike the shielding base members of the first and second embodiments, the shielding base member of the sixth embodiment employs, as the transparent substrate, instead of the glass substrate, the separator having a release layer on its surface. Therefore, in FIG. 8A and FIG. 8B, the same symbols are affixed to the same elements as those in FIG. 3A, and their detailed explanation is omitted.

As shown in FIG. 8A, the transparent substrate of the shielding base member 26e of the sixth embodiment is formed of a separator 40. This separator 40 consists of a silicone layer 40b and a PET film 40a.

When this shielding base member 26e is fitted to the display screen of the PDP, the silicone layer 40b is separated along the interface between the silicone layer 40b and the first adhesive layer 12 and then an exposed surface of the first adhesive layer 12 of the resulting structural unit B of the shielding base member, without the separator 40, is pasted directly onto the display screen of the PDP, whereby the structural unit B functions as the shielding member of the PDP.

When this shielding base member 26e of the sixth embodiment is fitted to the display screen of the PDP, the PET film 40a is not present. Therefore, the shielding base member has high optical transmittance and low haze.

Also, since the glass substrate is not needed, the structure of the shielding base member can be made simple. Thus, not only can the shielding base member of the sixth embodiment be manufactured easily, but also the production cost thereof can be reduced.

The reflection preventing layer 20 may be formed of either a PET reflection preventing layer or a TAC reflection preventing layer. If the PET reflection preventing layer is employed, the third adhesive layer 12b, for example, may have the ultraviolet (UV) absorbing function, like the first embodiment. If the TAC reflection preventing layer is employed, the TAC reflection preventing layer 20 itself may have the ultraviolet (UV) absorbing function, like the fourth embodiment. Also, like the first embodiment, at least one adhesive layer may have a color correcting function.

A shielding base member shown in FIG. 8B is a variation of the shielding base member 26e shown in FIG. 8A. The second adhesive layer 12a and the near-infrared absorbing layer 18 of the shielding base member 26e shown in FIG. 8A are omitted. In this variation, like the second embodiment, at least one of the first adhesive layer 12 and the third adhesive layer 12b may have a near-infrared absorbing function.

Next, the manufacturing method of the shielding base member 26e of the sixth embodiment will be explained hereunder.

First, according to a method similar to the first embodiment, the roll like separator 40 is a PET film 40a having one surface coated with the silicone layer 40b is prepared, then the separator 40 is extended, then the copper foil 16 is pasted onto the separator 40 via the first adhesive layer 12 and the resin layer 14, and then the copper layer pattern 16a is formed by patterning the copper foil 16 by the roll-to-roll method.

Then, the near-infrared absorbing layer 18 is formed on the copper layer pattern 16a and the resin layer 14 via a second adhesive layer 12a by the roll-to-roll method. Then, the PET or TAC reflection preventing layer 20 is formed on the near-infrared absorbing layer 18 via a third adhesive layer 12b.

In this case, like the variations of the first and fourth embodiments, instead of the near-infrared absorbing layer 18, the third adhesive layer 12b, and the reflection preventing layer 20, the surface of the PET or TAC film, which has the reflection preventing layer on one surface and the near-infrared absorbing layer on the other surface, may be pasted, on its near-infrared absorbing layer side, onto the second adhesive layer 12a over the separator 40.

Seventh Embodiment

FIG. 9A to FIG. 9G are schematic sectional views showing a shielding base member manufacturing method according to a seventh embodiment of the present invention. The seventh embodiment is intended not to leave dent defects in the adhesive layer, which remains in the final shielding base member, by replacing the adhesive layer of the shielding base member with a new adhesive layer in the course of the manufacturing steps. In this description, a detailed explanation of the steps similar to the manufacturing method of the first embodiment are omitted.

Figure 9A:
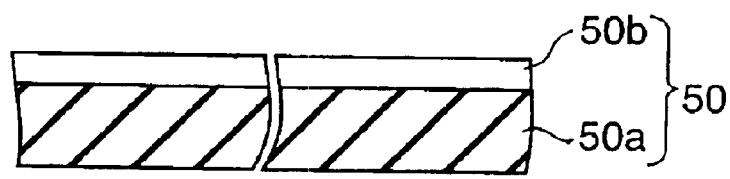
FIG. 9A to FIG. 9G are schematic sectional views showing a shielding base member manufacturing method according to a seventh embodiment of the present invention.

In the shielding base member manufacturing method according to the seventh embodiment, as shown in FIG. 9A, first a first PET film 50a that has a temporary adhesive layer 50b with a thickness of about 25 $\mu$m, for example, on one surface is prepared as a first protect film 50.

Then, a copper foil 16 (metal foil) whose thickness is about 10 $\mu$m, for example, is prepared. At this point the bright surface of the copper foil 16 has been blackened by electrolytic plating in the same way as in the first embodiment.

Figure 9B:
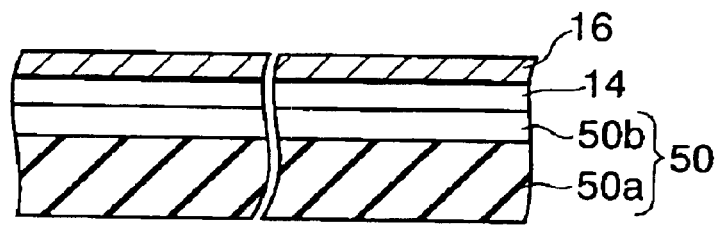

Then, as shown in FIG. 9B, the resin layer 14 is formed on the temporary adhesive layer 50b of the first protect film 50. The copper foil 16 is then arranged such that the blackened surface of the copper foil 16 is directed to and then pasted onto the resin layer 14 by applying the pressure to the copper foil 16 in the same method as in the first embodiment.

Accordingly, a structure in which the resin layer 14 and the copper foil 16 are laminated sequentially from the bottom on the first protect film 50 is formed. Since the copper foil 16 is pasted onto the first protect film 50, which is rigid and which has the temporary adhesive layer 50b, via the resin layer 14, the handling of the copper foil 16 is facilitated.

Figure 9C:
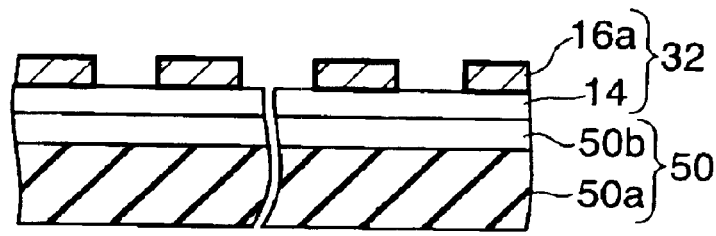

Then, as shown in FIG. 9C, the first protect film 50 is transported by the roll-to-roll method and a resist pattern (not shown) is formed on the copper foil 16. The copper foil 16 is then etched by spraying an iron (III) chloride aqueous solution, or the like onto the copper foil 16 in a manner similar to the first embodiment using the resist pattern as a mask to form the copper layer pattern 16a (pattern of the metal layer), like a mesh, for example.

At this time, since the copper foil 16 is pasted onto the first protect film 50 having rigidity, copper foil 16 can withstand the pressure of the sprayed etchant and thus the copper foil 16 remains stable throughout etching.

Then, the exposed surface of the copper layer pattern 16a is blackened by applying to the copper layer pattern 16a a mixed solution consisting of chlorite soda aqueous solution and caustic soda aqueous solution. Since the surface of the copper foil 16 on the resin layer 14 side has already been blackened as described above, both surfaces and the side surfaces of the copper layer pattern 16a are completely blackened, as shown in FIG. 9C, at a point of time when this step is ended.

In this manner, as shown in FIG. 9C, the first transfer sheet 32, consisting of the resin layer 14 and the copper layer pattern 16a, is formed on the first protect film 50.

In the above-described formation of the copper layer pattern 16a, etc., the roll-to-roll method is employed. Therefore, if the temporary adhesive layer 50b is pressed by foreign matter when the first protect film 50, on which the etching of the copper foil 16 has been completed, is wound on the roll, or the like, dent defects readily form in the temporary adhesive layer 50b because the temporary adhesive layer 50b itself is soft.

However, in the shielding base member manufacturing method of the present embodiment, as described later, the temporary adhesive layer 50b is replaced with a new and different first adhesive layer. Therefore, there is no problem even if dents form in the temporary adhesive layer 50b. In this case, the temporary adhesive layer is also called the first adhesive layer, and the first adhesive layer is also called the second adhesive layer.

Figure 9D:
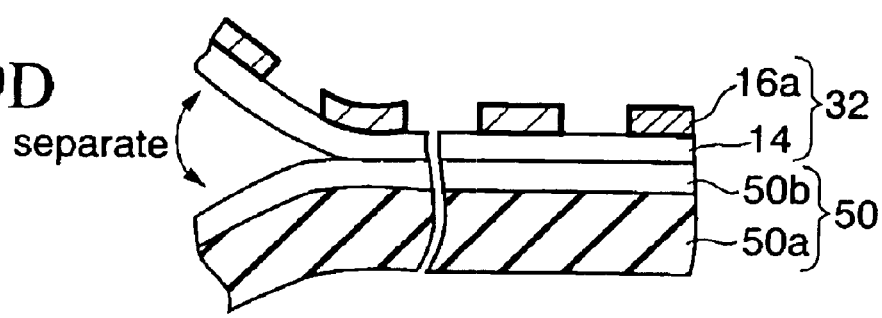

Then, as shown in FIG. 9D, the first transfer sheet 32 consisting of the resin layer 14 and the copper layer pattern 16a is obtained by cutting the first protect film 50 to a predetermined dimension and then separating the temporary adhesive layer 50b from the resin layer 14. At this time, the first protect film 50 having the temporary adhesive layer 50b with the dent defects discarded.

Figure 9E:
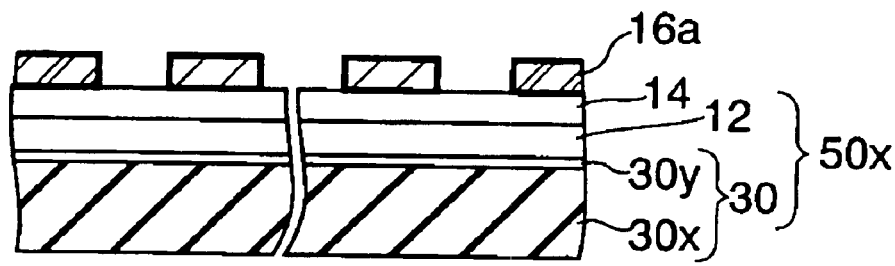

Then, as shown in FIG. 9E, a second PET film 30x, on one surface of which a silicone layer 30y (release layer) of about 1 $\mu$m thickness is coated and which has a predetermined dimension, is prepared. The silicone layer 30y is formed by the same method as used in the first embodiment. This second PET film 30x, on one surface of which the silicone layer 30y is formed, is called "separator 30" hereinafter.

Then, as shown in FIG. 9E, similarly, a second protect film 50x consisting of the separator 30 and the first adhesive layer 12 is formed by forming the first adhesive layer 12 of about 25 μm thickness on the silicone layer 30y of the separator 30. Then, the resin layer 14 and the copper layer pattern 16a are formed on the first adhesive layer 12 of the second protect film 50x by pasting the surface of the first adhesive layer 12 of the second protect film 50x onto the surface of the resin layer 14 of the above transfer sheet 32.

Accordingly, the first adhesive layer 12 is present under the resin layer 14 instead of the above-mentioned temporary adhesive layer 50b. In other words, even when dent defects are formed in the temporary adhesive layer 50b, such temporary adhesive layer 50b may be replaced with the new first adhesive layer 12 that has no such defects. Then, since there is no need to employ the roll-to-roll method after the step of forming the first adhesive layer 12 on the second protect film 50x, the first adhesive layer 12 is not wound onto the roll. Therefore, there is no possibility that dent defects due to foreign matter, or the like will newly form in the first adhesive layer 12. As a result, the first adhesive layer 12 that is left in the final shielding base member will have no dent defect.

Figure 9F:
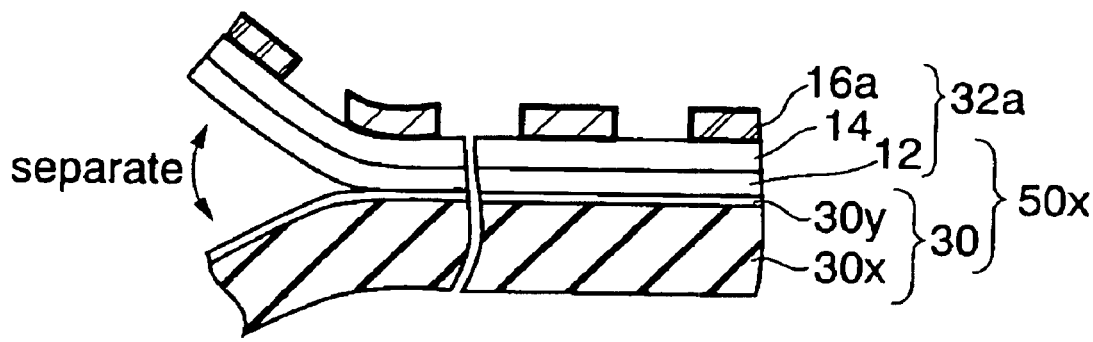

Then, the separator 30 is removed from the structural unit shown in FIG. 9F by separating the silicone layer 30y (release layer) of the separator 30 from the first adhesive layer 12 along the interface therebetween. Thus, the second transfer sheet 32a that consists of the first adhesive layer 12, the resin layer 14, and the copper layer pattern 16a in sequence from the bottom is obtained.

Figure 9G:
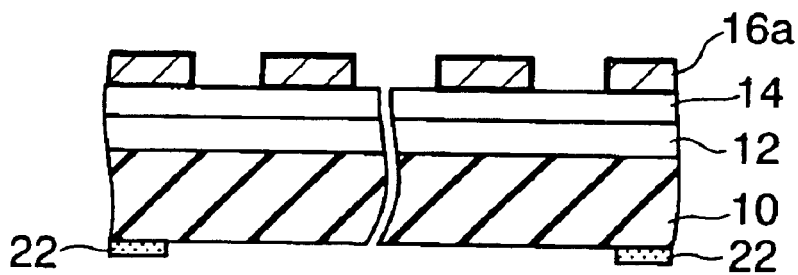

Then, as shown in FIG. 9G, the transparent glass substrate 10 (transparent substrate), on a predetermined peripheral portion of one surface of which the black frame layer 22 is formed and which has a predetermined dimension, is prepared. The surface of the first adhesive layer 12 of the transfer body 32a is pasted onto the surface of the glass substrate 10 opposite that on which the black frame layer 22 is formed. Accordingly, the first adhesive layer 12 which has no dent defects, the resin layer 14, and the copper layer pattern 16a are formed sequentially from the glass substrate 10.

Then, as shown in FIG. 3A (first embodiment), the second adhesive layer 12a having a color correcting function is formed on the copper layer pattern 16a and the resin layer 14 by the same method as used in the first embodiment, leaving exposed the copper layer pattern 16a on the predetermined peripheral portion of the glass substrate 10. Then, the near-infrared absorbing layer 18 is formed on this second adhesive layer 12a.

Then, the third adhesive layer 12b having the ultraviolet (UV) absorbing function is formed on the near-infrared absorbing layer 18. And then a PET reflection preventing layer 20 having a reflection preventing function is formed on the third adhesive layer 12b, using a PET film having a reflection preventing layer formed on one surface thereof, or the like.

In this manner, a shielding base member the same as the shielding base member 26 shown in FIG. 3A can be obtained by the method of the seventh embodiment.

As described above, the shielding base member manufacturing method of the seventh embodiment is provided to prevent the situations wherein the PET film (except the PET reflection preventing layer 20), whose optical transmittance is low and whose haze is high, would become incorporated into the shielding base member 26 and also to prevent the dent defects in the adhesive that is left in the shielding base member product.

More particularly, first the resin layer 14 and the copper foil 16 are formed on the first protect film 50, and then the copper layer pattern 16a is formed by patterning the copper foil 16. At this time, since the roll-to-roll method is employed for the purpose of improving the production efficiency, dent defects easily form in the temporary adhesive layer 50b. In order to remove the temporary adhesive layer 50b with the dent defects, the temporary adhesive layer 50b of the first protect film 50 is separated from the resin layer 14 along the interface. Thus, the first transfer sheet 32, consisting of the resin layer 14 and the copper layer pattern 16a formed thereon, is obtained.

A second protect film 50x is obtained by forming the first adhesive layer 12 on the silicone layer 30y (release layer) of the separator 30. Then, the surface of the resin layer 14, which does not carry a copper layer pattern, of the first transfer sheet 32 is adhered to the surface of the first adhesive layer 12 of the second protect film 50x. Accordingly, the new first adhesive layer 12 without any dent defect is provided under the resin layer 14.

Then, the second transfer sheet 32a, consisting of the first adhesive layer 12, the resin layer 14, and the copper layer pattern 16a, is obtained by separating the first adhesive layer 12 from the silicone layer 30y (release layer) of the separator 30 along the interface. Then, the exposed surface of the first adhesive layer 12 of this second transfer sheet 32a is pasted onto one surface of the glass substrate 10. Thus, the first adhesive layer 12 that has no dent defect, the resin layer 14, and the copper layer pattern 16a are formed on the glass substrate 10 sequentially from the bottom.

As described above, according to the method of the seventh present embodiment, since the PET films 50a, 30x do not remain in the shielding base member, the shielding base member has high optical transmittance and low haze. Also, since the copper foil 16 is formed on the first protect film 50 which is rigid, such copper foil 16 can be patterned by the roll-to-roll method while unrolling first protect film 50, and thus production efficiency can be improved.

In addition, even if the dent defects occur in the temporary adhesive layer 50b at this time, no dent defects will be present in the first adhesive layer 12 of the shielding base member because the temporary adhesive layer 50b can be replaced with a new first adhesive layer 12. Therefore, a shielding base member of high quality can be manufactured.

Eighth Embodiment

Figure 10A:
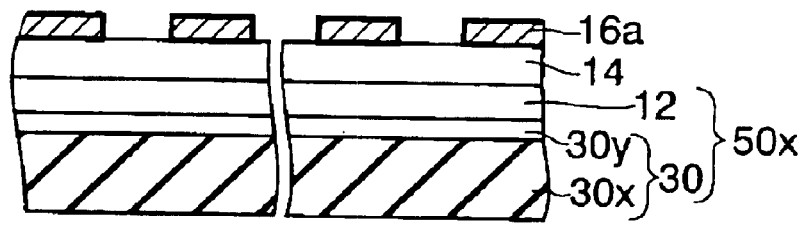
FIG. 10A to FIG. 10C are schematic sectional views showing a shielding base member manufacturing method according to an eighth embodiment of the present invention.
Figure 10B:
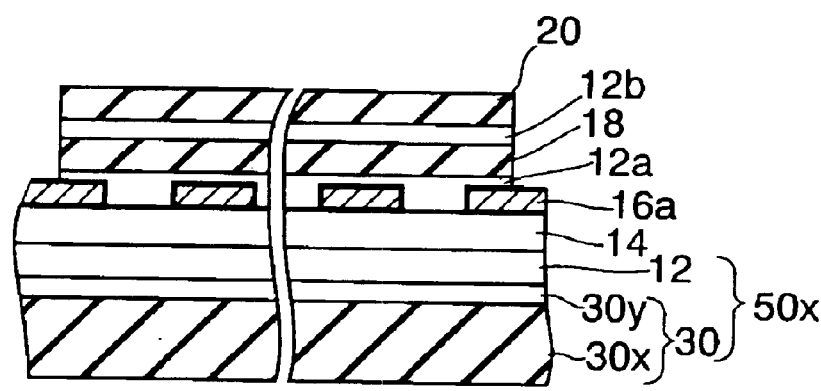
Figure 10C:
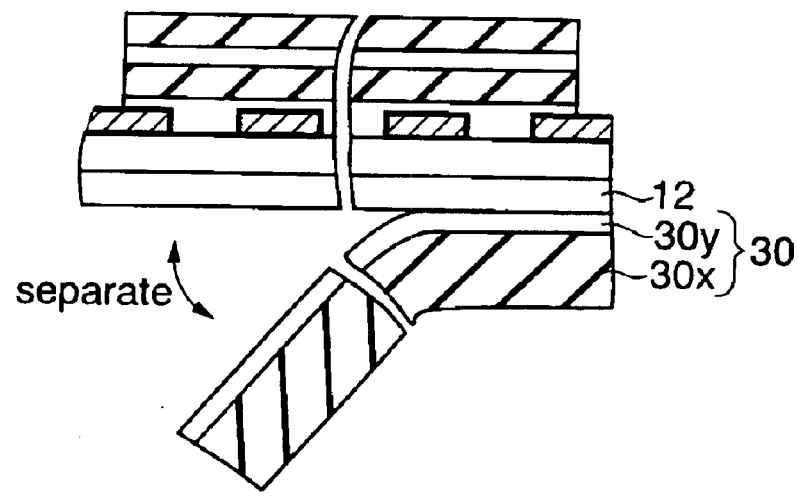
Figure 11:
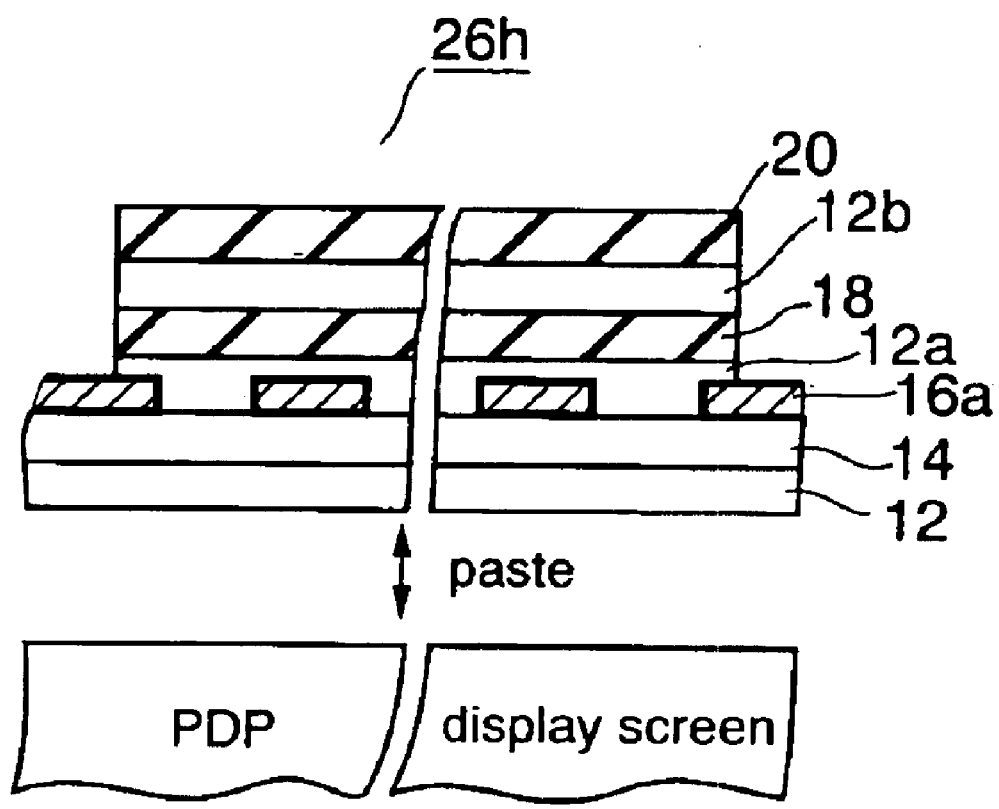
FIG. 11 is a schematic sectional view showing a shielding base member according to the eighth embodiment of the present invention.

FIG. 10A to FIG. 10C are schematic sectional views showing a shielding base member manufacturing method according to an eighth embodiment of the present invention, and FIG. 11 is a schematic sectional view showing a shielding base member according to the eighth embodiment of the present invention. The difference between the manufacturing method of the eighth embodiment and that of the sixth embodiment is that the second transfer sheet, consisting of the first adhesive layer, the resin layer, and the copper layer pattern, manufactured according to the method of the seventh embodiment, is pasted directly onto the display screen of the PDP to serve as the shielding base member.

In the manufacturing method of the eighth embodiment, as shown in FIG. 10A, first a structure the same as that shown in FIG. 9E in the seventh embodiment is formed. That is, a structure in which the first adhesive layer 12 has no dent defects, the resin layer 14, and the copper layer pattern 16a are formed on the second protect film 50x.

The second protect film 50x is cut to a predetermined size. Then, as shown in FIG. 10B, the second adhesive layer 12a is formed on the copper layer pattern 16a and the resin layer 14 leaving the copper layer pattern 16a exposed at the predetermined peripheral portion. Then, the near-infrared absorbing layer 18 is formed on the second adhesive layer 12a.

The third adhesive layer 12b is formed on the near-infrared radiation absorbing layer 18, and then the PET reflection preventing layer 20 is formed on the third adhesive layer 12b.

Then, as shown in FIG. 10C, the separator 30 is removed from the structural unit shown in FIG. 10B by separating the silicone layer 30y (release layer) of the separator 30 from the first adhesive layer 12 along their interface.

Accordingly, as shown in FIG. 11, a shielding base member 26h consisting of the first adhesive layer 12 that is free of dent defects, the resin layer 14, the copper layer pattern 16a, the second adhesive layer 12a, the near-infrared absorbing layer 18, the third adhesive layer 12b, and the PET reflection preventing layer 20, sequentially from the bottom, is obtained. Of course, the shielding base member may be constructed by omitting the near-infrared absorbing layer 18, the PET reflection preventing layer 20, etc.

Then, as shown in FIG. 11, the PDP shielding base member is obtained by pasting the exposed surface of the first adhesive layer 12 of the shielding base member 26h directly onto the display screen of the PDP.

According to the method of the eighth embodiment, since the PET film does not remain in the shielding base member 26h like the first embodiment, a shielding base member having high optical transmittance and low haze is easily manufactured. Also, since the first adhesive layer 12 having no dent defects remains in the shielding base member 26h, a shielding base member of the high quality can be manufactured.

In this case, as in the variation (the structure in FIG. 3B) of the first embodiment, the PET film 21, having the near-infrared absorbing layer 23 and the reflection preventing layer 25 respectively formed on its opposing surfaces, may be adhered to the second adhesive layer 12a. Also, like the second embodiment, the near-infrared absorbing layer may be omitted and the near-infrared absorbing function may be provided by the adhesive layer.

In addition, the TAC reflection preventing layer may be employed in place of the PET reflection preventing layer 20. The third adhesive layer 12b, for example, may have the ultraviolet (UV) absorbing function, as in the first embodiment, if the PET reflection preventing layer is employed, whereas the TAC reflection preventing layer itself may have an ultraviolet (UV) absorbing function, as in the fourth embodiment, if the TAC reflection preventing layer is employed. Also, like the first embodiment, at least one of the first, second, and third adhesive layers 12, 12a, 12b may have a color correcting function.

In the above manner, the shielding base member 26h of the eighth embodiment is manufactured.

Ninth Embodiment

Figure 12:
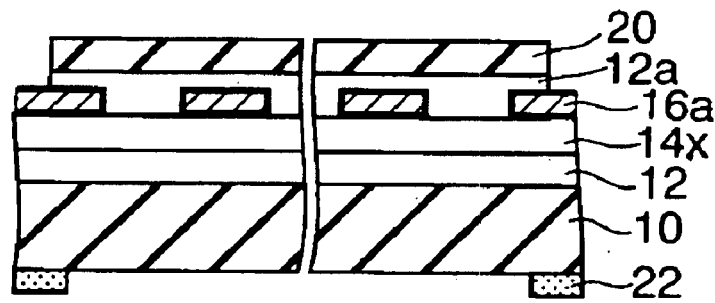
FIG. 12 is a schematic sectional view showing a shielding base member according to a ninth embodiment of the present invention.
Figure 13:
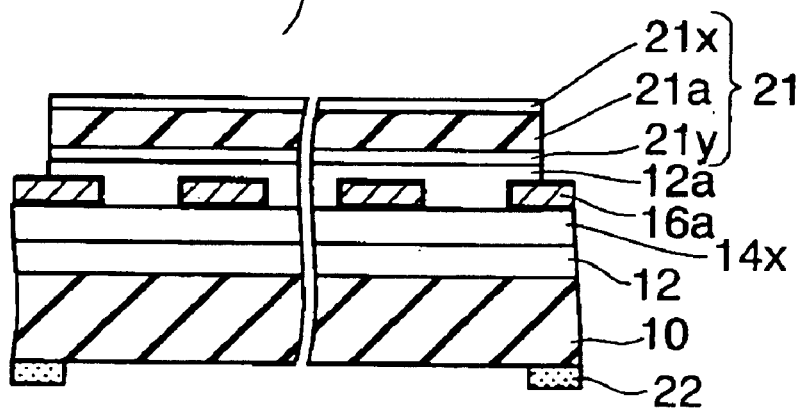
FIG. 13 is a schematic sectional view showing a variation of the shielding base member according to the ninth embodiment of the present invention.

FIG. 12 is a schematic sectional view showing a shielding base member according to a ninth embodiment of the present invention, and FIG. 13 is a schematic sectional view showing a variation of the shielding base member according to the ninth embodiment of the present invention. In FIG. 12 and FIG. 13, the same symbols are affixed to the same elements as those in FIG. 3A and others, and their detailed explanation is omitted.

The difference between the shielding base member of the ninth embodiment and that of the other embodiments is that, as shown in FIG. 12, the plastic film having the near-infrared absorbing function is not utilized as the near-infrared absorbing layer and, instead, the near-infrared absorbing function is provided by a resin layer 14x.

The method of the ninth embodiment is the same as the manufacturing methods of the first and seventh embodiments except for the resin layer forming step. Therefore, the step of forming the resin layer 14x having the near-infrared absorbing function on the first adhesive layer 12 will be explained here.

First, coating liquids for forming the near-infrared absorbing layer are prepared by stirring a mixture of pigment material (Tx-EX811K manufactured by Nippon Shokubai Co., Ltd.), acrylic resin (Dianal BR-80 manufactured by Mitsubishi Rayon Co., Ltd.), toluene, and methyl ethyl ketone, with the pigment content of the different coating liquids at 1 wt %, 2 wt %, 3 wt %, and 3 wt %, respectively.

Then, this coating liquid is coated on the first adhesive layer 12 by the roll coating method, or the like, and then this first adhesive layer 12 is left as is at about 50° C. for 48 hours, for example. Accordingly, the resin layer 14x having the near-infrared absorbing function is formed on the first adhesive layer 12. The resin layer 14x obtained in this manner can absorb the spectrum near 820 nm that is emitted from the PDP.

Alternatively, coating liquids for forming the near-infrared absorber are prepared by stirring mixtures of copolymer polyester resin, methyl ethyl ketone, and toluene with 1 wt %, 2 wt %, 3 wt %, and 3 wt %, respectively, of pigment material (Kayasorb IRG-022 manufactured by Nippon Kayaku Co., Ltd.). Then, this coating liquid is coated on the first adhesive layer 12 by the roll coating method, or the like, and then the resin layer 14x having the near-infrared absorbing function is formed by leaving this first adhesive layer 12 as is at about 50° C. for 48 hours, for example. The resin layer 14x obtained in this manner can absorb the spectrum of 850 to 1200 nm that is emitted from the PDP.

In this case, since the maximum absorption wavelength differs according to the color tone of the pigment material, the type of the pigment material can be adjusted appropriately to meet the requirement of the shielding base member. For example, one type of pigment material may be employed, or plural different pigment materials may be employed to absorb the light in the wide area of the near-infrared range. It is preferable that at least the pigment material having the maximum absorption wavelengths such as 820 nm, 880 nm, 980 nm, etc., which are used particularly in remote control units and in optical communication, in the near-infrared range should be blocked.

It is preferable that plural pigment materials should be contained in the resin layer 14x so as to absorb the near-infrared radiation in the predetermined wavelength range. In this case, if the resin layer 14x contains a plurality of pigment materials, the possibility that durability may be reduced by the catalytic effect, etc., must be considered. That is, in some cases optical characteristics such as the near-infrared shielding characteristic, the color, etc. of the resin layer 14x change with the lapse of time.

Therefore, if one type or several types of pigment materials are included in the resin layer 14x and if pigment materials which can absorb the near-infrared radiation of the wavelength that cannot be absorbed by the resin layer 14x, are included in the second adhesive layer 12a or in the PET reflection preventing layer 20, near-infrared radiation over a wide wavelength range may be absorbed.

For example, if the above resin layer 14x that can absorb the spectrum near 820 nm is employed, the pigment material that can absorb the spectrum of 850 to 1200 nm may be included in the second adhesive layer 12a or in the PET reflection preventing layer 20. Also, if the above resin layer 14x that can absorb the spectrum of 850 to 1200 nm is employed, the pigment material that can absorb the spectrum near 820 nm maybe included in the second adhesive layer 12a or in the PET reflection preventing layer 20.

In addition, the color correcting function for correcting the transmission color, the object color, etc. may be provided by including the pigment, which can absorb wavelengths in the visible range, in the resin layer 14x. For instance, a mixed gas consisting of xenon and neon is employed as a discharge medium in the color PDP, and the orange light emission of the neon acts as one factor to lower the color display performance of the PDP. For this reason, the color correction in the color display of the PDP can be provided by including a pigment material which can suppress the light emission of the neon, for example in the resin layer 14x.

In this manner, in the shielding base member 26i of the present embodiment, a plastic film having the near-infrared absorbing function is not particularly needed and the near-infrared absorbing function is provided by the resin layer 14x itself. Therefore, the structure of the shielding base member 26i can be made simple. Also, since the plastic film serving as the near-infrared absorbing layer is omitted, the optical transmittance becomes higher and the haze becomes lower, and thus the display of the PDP is further improved.

Next, a variation of the shielding base member of the ninth embodiment will be explained. According to this variation, if only one type or several types of pigment materials are added to improve the durability of the resin layer 14x, the near-infrared radiation wavelengths that cannot be absorbed by the resin layer 14x are shielded by the multi-layered film that cuts off the near-infrared radiation by utilizing the reflection characteristic (optical interference) of the light.

First, as shown in FIG. 13, a structural body in which the first adhesive layer 12, the resin layer 14x for absorbing light of a particular wavelength, and the copper layer pattern 16a are formed on the glass substrate 10 by the manufacturing method of the first or seventh embodiment. As also shown in FIG. 13, a highly transparent polyester film 21a is then prepared and a multi-layered film 21y is formed by laminating a metal oxide thin film such as zinc oxide, indium oxide, or the like and a metal thin film such as silver, silver alloy, or the like on one surface of the film 21a by the sputtering method or the like. For example, a multi-layered film 21 may be formed by repeating three to six times the formation of a film consisting of a metal oxide thin film/a metal thin film. Then, a multi-layered film 21 is obtained by forming a reflection preventing layer 21x on the other surface of the highly transparent polyester film 21a.

Instead of formation of the multi-layered film 21y on the highly transparent polyester film 21a, a film having the near-infrared shielding function is provided by laminating the highly transparent resin films, each having a different refractive index, and then the multi-layered film 21 may be produced by forming the reflection preventing layer 21x on this film.

The multi-layered film 21 formed in this manner can reflect light in a predetermined near-infrared range by utilizing the light reflection characteristic (optical interference) of the multi-layered film 21y to shield the light and also to have the light reflection preventing function.

Then, as also shown in FIG. 13, the second adhesive layer 12a is formed on the copper layer pattern 16a and the resin layer 14x, and then the surface of the multi-layered film 21 on the multi-layered film 21y side is adhered to the glass substrate 10 via the second adhesive layer 12a. Accordingly, the multi-layered film 21 having the multi-layered film 21y and the reflection preventing layer 21x is formed on the second adhesive layer 12a. In the above manner, the shielding base member 26j of the variation of the ninth embodiment is completed.

The shielding shielding base member 26j of this variation of the ninth embodiment provides substantially the same functions and effects as the previously described shielding base member 26i. Also, since a highly transparent polyester film is used as the plastic film, the optical transmittance of the shielding base member can be increased and the haze can be reduced.

The details of the present invention are explained as above with reference to the first to ninth embodiments. However, the scope of the present invention is not limited to the above embodiments and variations of the above embodiments which do not depart from the gist of the present invention are contained in the scope of the present invention.

What is claimed is:

1. A shielding base member comprising, in sequence:
    a transparent substrate;
    a first adhesive layer formed on the transparent substrate;
    a resin layer formed on the first adhesive layer;
    a metal layer pattern formed on the resin layer; and
    a reflection preventing layer formed on the metal layer pattern via a third adhesive layer, said shielding base member being produced by the process comprising:
    forming on a release surface of a plastic support film, in sequence, a first adhesive layer, a resin layer, and a metal foil;
    forming a pattern in the metal foil;
    removing the plastic support film by separating the plastic support film at the interface between the release surface and the first adhesive layer; and
    then adhering the first adhesive layer, without the plastic support film, onto a transparent substrate to form the shielding base member, wherein the first adhesive layer is in direct contact with the transparent substrate, the resin layer is in direct contact with the first adhesive layer, and the metal layer pattern is in direct contact with the resin layer.

2. The shielding base member according to claim 1, further comprising:
    a plastic film on one surface of which a reflection preventing layer is formed;
    a near-infrared absorbing layer formed on another surface of the plastic film for absorbing near-infrared radiation in the range of 820 to 1200 nm; and
    wherein the third adhesive layer formed over near-infrared absorbing layer is adhered to the transparent substrate.

3. The shielding base member according to claim 1, wherein surfaces of the metal layer pattern on a resin layer side and a surface and side surfaces of the reflection preventing layer are black.

4. The shielding base member according to claim 1, wherein at least one of the first adhesive layer and the third adhesive layer absorbs near-infrared radiation in the range of 820 to 1200 nm.

5. The shielding base member according to claim 1, further comprising:

a near-infrared absorbing layer formed on the metal layer pattern and the resin layer via a second adhesive layer and between the metal layer pattern and the third adhesive layer.

6. The shielding base member according to claim 1, wherein the reflection preventing layer is formed on a PET (polyethylene terephthalate) film, and at least one of the adhesive layers has an ultraviolet absorbing function.

7. The shielding base member according to claim 1, wherein the reflection preventing layer is formed on a triacetylcellulose film and has an ultraviolet absorbing function.

8. The shielding base member according to claim 1, wherein at least one of the adhesive layers has a color correcting function.

9. The shielding base member according to claim 1, wherein the transparent substrate is formed of glass.

10. A shielding base member comprising, in sequence:

a transparent substrate;

a first adhesive layer formed on the transparent substrate;

a resin layer formed on the first adhesive layer and having at least a function of absorbing near-infrared radiation in a range of 820 to 1200 nm;

a metal layer pattern formed on the resin layer; and a filter layer formed on the metal layer via a second adhesive layer and having at least a reflection preventing function; and wherein the shielding base member is produced by the process comprising;

forming on a release surface of a plastic support film, in sequence a first adhesive layer, a resin layer, and a metal foil;

forming a pattern in the metal foil;

removing the plastic support film by separating the plastic support film at the interface between the release surface and the first adhesive layer; and then adhering the first adhesive layer, without the plastic support film, onto a transparent substrate to form the shielding base member, wherein the first adhesive layer is in direct contact with the transparent substrate, the resin layer is in direct contact with the first adhesive layer, and the metal layer pattern is in direct contact with the resin layer.

11. The shielding base member according to claim 10, wherein the resin layer includes a pigment material that absorbs the near-infrared radiation.

12. The shielding base member according to claim 10, wherein the resin layer further has a color correcting function.

13. The shielding base member according to claim 11, wherein the filter layer further has a function of absorbing the near-infrared radiation having a different wavelength than the wavelength of the near-infrared radiation which is absorbed by the resin layer.

14. The shielding base member according to claim 11, wherein the filter layer includes a plastic film, a reflection preventing layer formed on one surface of the plastic film, and a layer for absorbing the near-infrared radiation formed on another surface of the plastic film.

15. The shielding base member according to claim 11, wherein the filter layer includes a plastic film, a reflection preventing layer formed on one surface of the plastic film, and a layer for shielding the near-infrared radiation formed on another surface of the plastic film, the filter layer having a multi-layered structure further including a metal oxide layer and a metal film.

16. The shielding base member according to claim 2 wherein the near-infrared absorbing layer is adhered to an exposed surface of the glass substrate.

* * * * *

UNITED STATES PATENT AND TRADEMARK OFFICE
CERTIFICATE OF CORRECTION

PATENT NO.  : 6,808,773 B2
DATED       : October 26, 2004
INVENTOR(S) : Shimamura et al.

It is certified that error appears in the above-identified patent and that said Letters Patent is hereby corrected as shown below:

Title page,
Item [56] References Cited, FOREIGN PATENT DOCUMENTS, insert the following:
-- JP 2001-59085  3/2001
  EP 1043606  A1 3/2000 --.

Column 22,
Line 59, after "over" insert -- the --.

Signed and Sealed this

Seventh Day of June, 2005

JON W. DUDAS
*Director of the United States Patent and Trademark Office*